(12) United States Patent
Aikawa

(10) Patent No.: US 11,402,764 B2
(45) Date of Patent: Aug. 2, 2022

(54) TONER DETECTING DEVICE

(71) Applicant: KYOCERA Document Solutions Inc., Osaka (JP)

(72) Inventor: Yukihiro Aikawa, Osaka (JP)

(73) Assignee: Kyocera Document Solutions, Inc.

( * ) Notice: Subject to any disclaimer, the term of this patent is extended or adjusted under 35 U.S.C. 154(b) by 493 days.

(21) Appl. No.: 16/486,253

(22) PCT Filed: Dec. 7, 2017

(86) PCT No.: PCT/JP2017/044058
§ 371 (c)(1),
(2) Date: Aug. 15, 2019

(87) PCT Pub. No.: WO2018/142760
PCT Pub. Date: Aug. 9, 2018

(65) Prior Publication Data
US 2020/0192238 A1    Jun. 18, 2020

(30) Foreign Application Priority Data

Jan. 31, 2017  (JP) .............................. JP2017-015405

(51) Int. Cl.
*G03G 15/08* (2006.01)
*G01F 22/00* (2006.01)
*H05K 1/16* (2006.01)

(52) U.S. Cl.
CPC ........... *G03G 15/086* (2013.01); *G01F 22/00* (2013.01); *H05K 1/165* (2013.01); *H05K 2201/10151* (2013.01)

(58) Field of Classification Search
CPC ................................................... G03G 15/086
See application file for complete search history.

(56) References Cited

U.S. PATENT DOCUMENTS

| | | | | |
|---|---|---|---|---|
| 2007/0086797 A1* | 4/2007 | Watanabe | .......... | G03G 15/0891 399/30 |
| 2009/0279907 A1* | 11/2009 | Tanaka | ............... | G03G 15/0849 399/27 |
| 2015/0086229 A1* | 3/2015 | Naruse | ............... | G03G 15/0851 399/30 |
| 2017/0255129 A1* | 9/2017 | Suzuki | ............... | G03G 15/0853 |

FOREIGN PATENT DOCUMENTS

| | | |
|---|---|---|
| JP | 2002-296236 | 10/2002 |
| JP | 2008-203064 | 9/2008 |

* cited by examiner

*Primary Examiner* — Noam Reisner

(57) ABSTRACT

A resonance circuit (2) includes a capacitor (C1) and an inductor (L1, L2) of which an inductance is changed depending on developer including toner, and generates an output voltage corresponding to the inductance. A detecting circuit (3) detects the toner on the basis of the output voltage. An adjustment-purpose closed circuit (4) includes a semi-fixed resistor (VR1) and an adjustment inductor (L3) that forms magnetic coupling with the inductor (L1, L2), and causes an inductance of the inductor (L1, L2), a resonance frequency of the resonance circuit (2), an amplitude of the output voltage and a detected toner amount to be adjustable with a variable resistance value of the semi-fixed resistor (VR1).

4 Claims, 4 Drawing Sheets

PRIOR ART

PRIOR ART

TONER DETECTING DEVICE

TECHNICAL FIELD

The present invention relates to a toner detecting device.

BACKGROUND ART

FIG. 3 shows a circuit diagram that indicates a configuration of a toner density detecting device (see PATENT LITERATURE #1, for example). In the toner density detecting device shown in FIG. 3, a reference signal generated by an oscillation circuit 101 is inputted via a resistance R101 to a resonance circuit 102. The resonance circuit 102 includes inductors (coils) L101 and L102, and a capacitor (condenser) C101. Inductances of the inductors L101 and L102 are changed depending on a toner amount in developer 111 (e.g. two-component developer including non-magnetic toner and magnetic carrier) including toner. Therefore, a resonance frequency of the resonance circuit 102 is changed depending on the toner amount, and an impedance at a frequency of the reference signal is also changed, and thereby an output voltage of the resonance circuit 102 is changed depending on the toner amount. Further, an adjusting circuit 103 is installed in the toner density detecting device shown in FIG. 3. The adjusting circuit 103 includes a series circuit of a capacitor C102 and a varicap diode VC, and changes a capacitance of the varicap diode VC using a control signal and thereby adjusts the resonance frequency.

Further, FIG. 4 shows a circuit diagram that indicates a configuration of another toner density detecting device (see PATENT LITERATURE #2, for example). The toner density detecting device shown in FIG. 4 is a Colpitt-type LC oscillation circuit, and includes a resonance circuit 121, a transistor Q121, and a resistor R121. The resonance circuit 121 includes an inductor L121, and capacitors C121 and C122. An inductance of the inductor L121 is changed depending on a toner amount in developer 131 (e.g. two-component developer including non-magnetic toner and magnetic carrier) including toner. Therefore, a resonance frequency of the resonance circuit 121 is changed depending on the toner amount, and thereby an oscillation frequency of the LC oscillation circuit shown in FIG. 4 is changed depending on the toner amount.

CITATION LIST

Patent Literature

PATENT LITERATURE #1: Japan Patent Application Publication No. 2002-296236.
PATENT LITERATURE #2: Japan Patent Application Publication No. 2008-203064.

SUMMARY OF INVENTION

Technical Problem

The aforementioned toner density detecting device is built in an image forming apparatus such as printer or multi function peripheral. It is favorable that the aforementioned resonance frequency is adjustable in each individual such that plural image forming apparatuses detect same toner amounts under same conditions.

The aforementioned toner density detecting device provides the control signal to the varicap diode VC and thereby enables to adjust the resonance frequency. However, in this configuration, only a narrow capacitance range can be adjusted with the varicap diode and consequently, adequate adjustment may not be performed; and proper adjustment may not be performed because of capacitance fluctuation of the varicap diode VC due to environmental temperature fluctuation. Further, this device requires a circuit to provide the control signal, and therefore, the adjusting circuit 103 gets complicated, and a high device cost is required.

The present invention has been conceived in view of the aforementioned problem. It is an object of the present invention to achieve a toner detecting device that properly detects toner with a relatively low cost.

Solution to Problem

A toner detecting device according to the present invention includes: a resonance circuit that includes a capacitor and an inductor of which an inductance is changed depending on developer including toner, and generates an output voltage corresponding to the inductance; a detecting circuit that detects the toner on the basis of the output voltage; and an adjustment-purpose closed circuit that includes a variable load and an adjustment inductor that forms magnetic coupling with the inductor of the resonance circuit.

Advantageous Effect of Invention

On the basis of the present invention, achieved is a toner detecting device that properly detects toner with a relatively low cost.

These and other objects, features and advantages of the present invention will become more apparent upon reading of the following detailed description along with the accompanied drawings.

DESCRIPTION OF EMBODIMENTS

Hereinafter, embodiments according to aspects of the present invention will be explained with reference to drawings.

Embodiment 1

Figure 1:
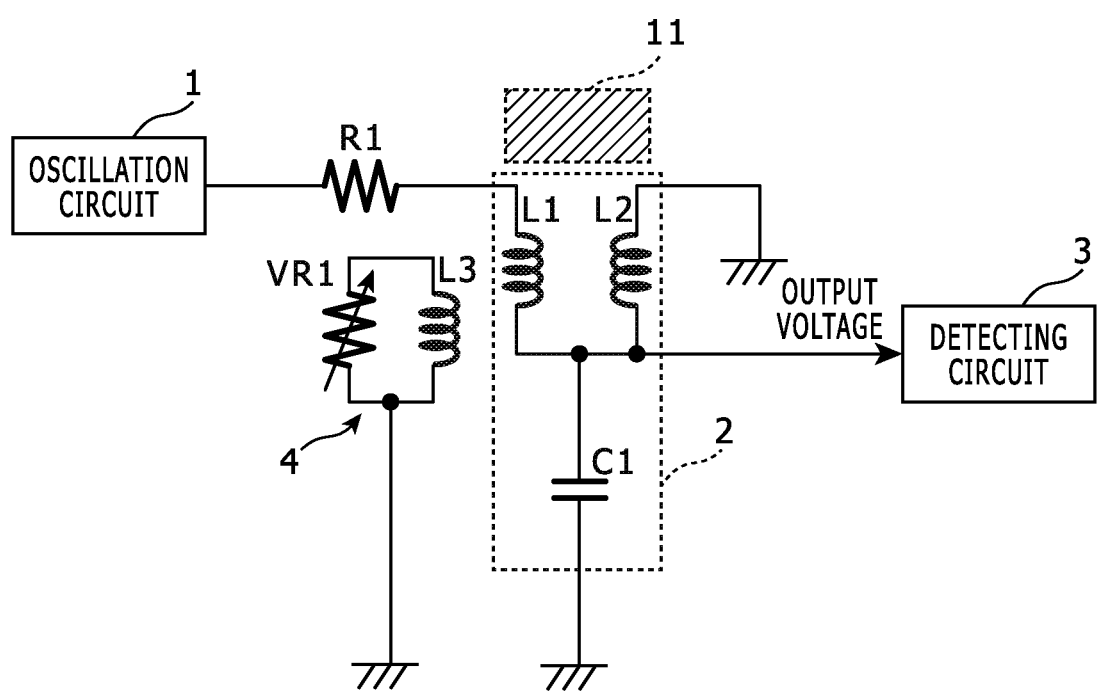
FIG. 1 shows a circuit diagram that indicates a configuration of a toner detecting device in Embodiment 1 of the present invention.

FIG. 1 shows a circuit diagram that indicates a configuration of a toner detecting device in Embodiment 1 of the present invention.

The toner detecting device shown in FIG. 1 is built in an electrophotographic-type image forming apparatus such as printer or multi function peripheral, is installed to a development device built in the image forming apparatus, and detects (a) an amount of toner in the development device and/or (b) presence or absence of toner in the development device.

The toner detecting device shown in FIG. 1 includes an oscillation circuit 1, a resonance circuit 2, a detecting circuit 3, and an adjustment-purpose closed circuit 4.

The oscillation circuit 1 oscillates and thereby generates a reference signal of a predetermined frequency, and provides the reference signal to the resonance circuit 2 through a resistance R1.

The resonance circuit 2 includes inductors L1 and L2, and a capacitor C1. Inductances of the inductors L1 and L2 are changed depending on developer 11 including toner. Thereby, the resonance circuit 2 generates an output voltage corresponding to the inductance(s) corresponding to the developer 11. The resonance circuit 2 generates the output voltage corresponding to an inputted reference signal. This output voltage has an amplitude that corresponds to (a) an amplitude of the inputted reference signal and (b) an impedance of the resonance circuit 2 corresponding to a frequency of the reference signal.

The detecting circuit 3 detects toner on the basis of the output voltage (in Embodiment 1, an amplitude of the output voltage).

In Embodiment 1, the developer 11 may be two-component developer including non-magnetic toner and magnetic carrier or may be one-component developer including magnetic toner. In case of using two-component developer, when toner is decreased, a density of magnetic carrier is increased, and consequently, inductances of the inductors L1 and L2 are increased; and in case of using one-component developer, when toner is decreased, inductances of the inductors L1 and L2 are decreased. Thus, when a toner amount is changed, an amplitude of the output voltage changes in different manners corresponding to different types of the developer 11 (i.e. two-component developer and one-component developer). Therefore, the detecting circuit 3 detects an amount of toner and/or presence or absence of toner on the basis of a characteristic (a characteristic of the toner amount for an amplitude of the output voltage) corresponding to a type of the developer 11.

Further, the adjustment-purpose closed circuit 4 includes an adjustment inductor L3 that forms magnetic coupling with the inductors L1 and L2, and a variable load (here, a semi-fixed resistor VR1). This variable load may be a variable resistor. An amount of a current that flows through the adjustment inductor L3 and the variable load can be adjusted by changing a resistance value of this variable load. Therefore, inductances of the inductors L1 and L2 with which the adjustment inductor L3 forms magnetic coupling may be adjusted by changing a resistance value of this variable load.

The following part explains a behavior of the toner detecting device in Embodiment 1.

In the toner detecting device in Embodiment 1, as mentioned, an amplitude of the output voltage gets a value corresponding to an amount of toner in the development device. Therefore, the detecting circuit 3 detects an amplitude of the output voltage, and determines a current amount of the toner, and/or presence or absence of the toner on the basis of the detected amplitude.

Hereupon, a resistance value of the variable load is manually adjusted before the shipment or in maintenance after the shipment such that an amplitude of the output voltage (or a detected toner amount) gets a predetermined value when a predetermined amount (100%, 0% or the like) of toner remains in the development device. Consequently, the toner amount is correctly detected, and plural image forming apparatuses detect the toner amounts with small dispersion.

As mentioned, in Embodiment 1, the resonance circuit 2 includes a capacitor C1 and an inductor L1 or L2 of which an inductance is changed depending on developer including toner, and generates an output voltage corresponding to the inductance corresponding to the developer. The detecting circuit 3 detects the toner on the basis of the output voltage. The adjustment-purpose closed circuit 4 includes the semi-fixed resistor VR1 and the adjustment inductor L3 that forms magnetic coupling with the inductor L1 or L2, and causes an inductance of the inductor L1 or L2, a resonance frequency of the resonance circuit 2, an amplitude of the output voltage and a detected toner amount to be adjustable with a variable resistance value of the semi-fixed resistor VR1.

Consequently, toner is properly detected with a relatively low cost.

Embodiment 2

Figure 2:
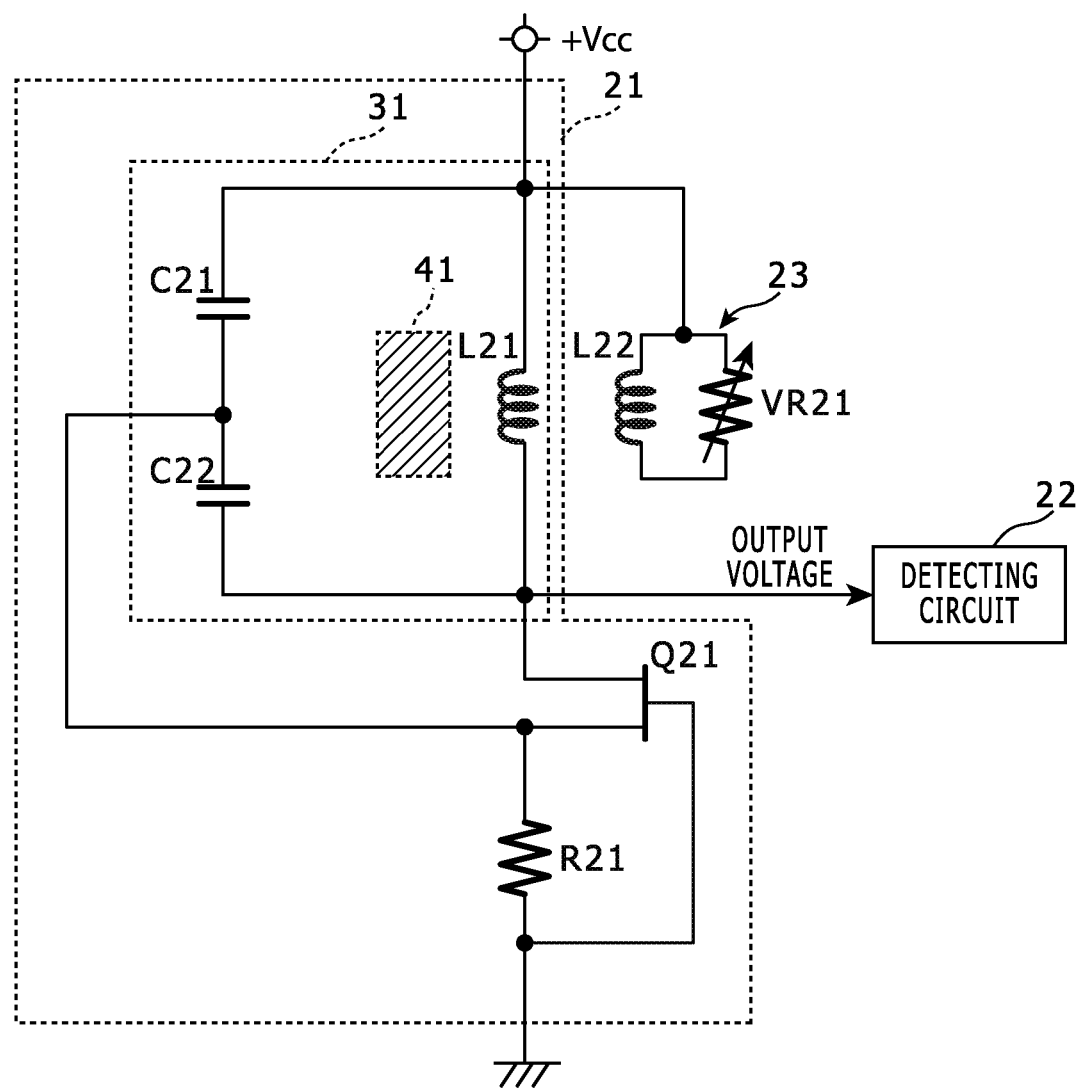
FIG. 2 shows a circuit diagram that indicates a configuration of a toner detecting device in Embodiment 2 of the present invention.
Figure 3:
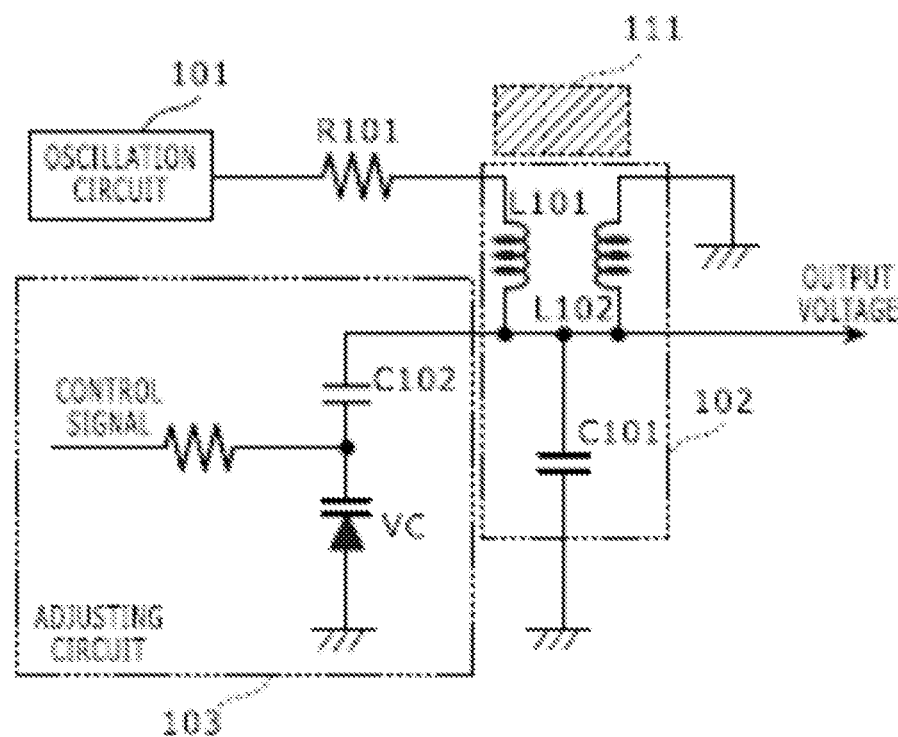
FIG. 3 shows a circuit diagram that indicates a configuration of a toner density detecting device.
Figure 4:
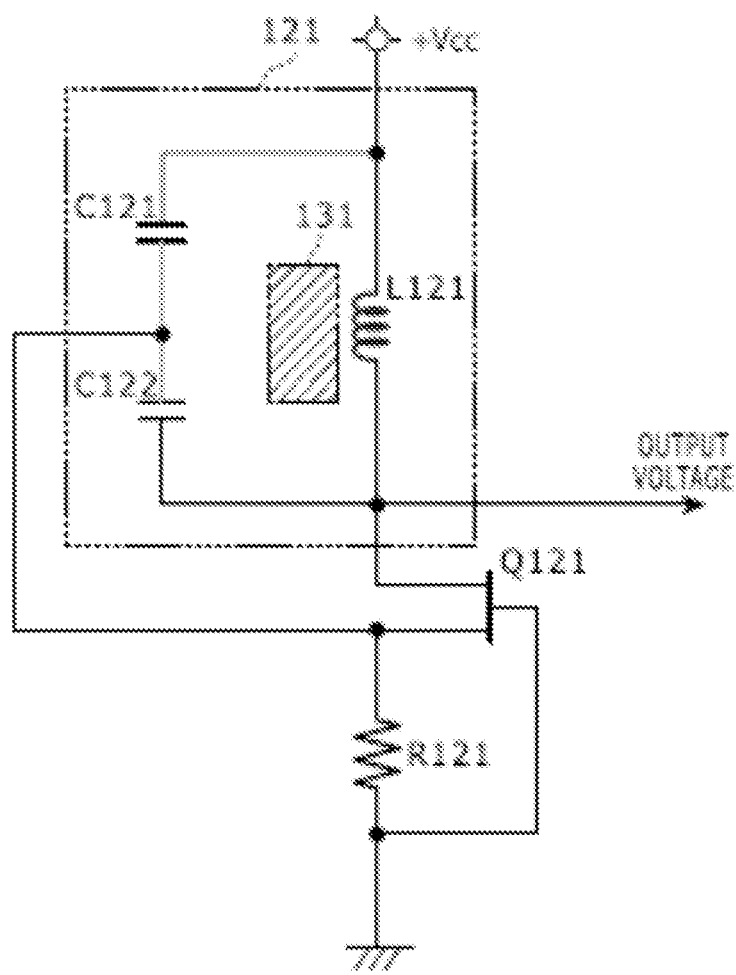
FIG. 4 shows a circuit diagram that indicates a configuration of another toner density detecting device.

FIG. 2 shows a circuit diagram that indicates a configuration of a toner detecting device in Embodiment 2 of the present invention.

The toner detecting device shown in FIG. 2 is built in an electrophotographic-type image forming apparatus such as printer or multi function peripheral, is installed to a development device built in the image forming apparatus, and detects an amount of toner and/or presence or absence of toner in the development device.

The toner detecting device in Embodiment 2 includes an LC oscillation circuit 21, a detecting circuit 22, and an adjustment-purpose closed circuit 23. In FIG. 2, the LC oscillation circuit 21 is a Colpitt-type LC oscillation circuit, but may be an LC oscillation circuit of another type.

The LC oscillation circuit 21 includes a resonance circuit 31, a transistor Q21, and a resistor R21.

The resonance circuit 31 includes an inductor L21 and capacitors C21 and C22. An inductance of the inductor L21 is changed depending on developer 41 including toner. Thereby, the resonance circuit 31 generates an output voltage corresponding to the inductance corresponding to the developer 41. Specifically, the LC oscillation circuit 21 shown in FIG. 2 oscillates at a resonance frequency of the resonance circuit 31, and thereby generates an output voltage.

The detecting circuit 22 detects toner on the basis of the output voltage (in Embodiment 2, a frequency of the output voltage).

In Embodiment 2, the developer 41 may be two-component developer including non-magnetic toner and magnetic carrier or may be one-component developer including magnetic toner. In case of using two-component developer, when toner is decreased, a density of magnetic carrier is increased, and consequently, an inductance of the inductor is increased; and in case of using one-component developer, when toner is decreased, an inductance of the inductor is decreased. Thus, when a toner amount is changed, a frequency of the output voltage changes in different manners corresponding to different types of the developer 41 (i.e. two-component developer and one-component developer). Therefore, the detecting circuit 22 detects an amount of toner and/or presence or absence of toner on the basis of a characteristic (a characteristic of the toner amount for a frequency of the output voltage) corresponding to a type of the developer 41.

Further, the adjustment-purpose closed circuit 23 includes an adjustment inductor L22 that forms magnetic coupling with the inductor L21, and a variable load (here, a semi-fixed resistor VR21). This variable load may be a variable resistor. An amount of a current that flows through the adjustment inductor L22 and the variable load is adjusted by changing a resistance value of this variable load. Therefore, an inductance of the inductors L21 with which the adjustment inductor L22 forms magnetic coupling may be adjusted by changing a resistance value of this variable load.

The following part explains a behavior of the toner detecting device in Embodiment 2.

In the toner detecting device in Embodiment 2, as mentioned, a frequency of the output voltage gets a value corresponding to an amount of toner in the development device. Therefore, the detecting circuit 22 detects a frequency of the output voltage, and determines a current amount of the toner, and/or presence or absence of the toner on the basis of the detected frequency.

Hereupon, a resistance value of the variable load is manually adjusted before the shipment or in maintenance after the shipment such that a frequency of the output voltage (or a detected toner amount) gets a predetermined value when a predetermined amount (100%, 0% or the like) of toner remains in the development device. Consequently, plural image forming apparatuses detect the toner amounts with small dispersion.

As mentioned, in Embodiment 2, the resonance circuit 31 includes capacitors C21 and C22 and an inductor L21 of which an inductance is changed depending on developer including toner, and generates an output voltage corresponding to the inductance. The detecting circuit 22 detects the toner on the basis of the output voltage. The adjustment-purpose closed circuit 23 includes a semi-fixed resistor VR21 and an adjustment inductor L22 that forms magnetic coupling with the inductor L21, and causes an inductance of the inductor L21, a resonance frequency of the resonance circuit 31, a frequency of the output voltage and a detected toner amount to be adjustable with a variable resistance value of the semi-fixed resistor VR21.

Consequently, toner is properly detected with a relatively low cost.

Further, it should be understood that various changes and modifications to the embodiments described herein will be apparent to those skilled in the art. Such changes and modifications may be made without departing from the spirit and scope of the present subject matter and without diminishing its intended advantages. It is therefore intended that such changes and modifications be covered by the appended claims.

For example, in Embodiment 1 or 2, the inductor L1, L2 or L21 of the resonance circuit 2 or 31 or the adjustment inductor L3 or L22 may be formed with a wiring pattern on a printed circuit board or may be an inductor element that a conductor is would up around a bobbin. The inductor L1, L2 or L21 of the resonance circuit 2 or 31 and the adjustment inductor L3 or L22 may be formed with wiring patterns on different layers in a multi-layer circuit board, respectively.

INDUSTRIAL APPLICABILITY

For example, the present invention is applicable to an image forming apparatus.

The invention claimed is:

1. A toner detecting device, comprising:
   a resonance circuit that comprises a capacitor and an inductor of which an inductance is changed depending on developer including toner, and generates an output voltage corresponding to the inductance;
   a detecting circuit that detects the toner on the basis of the output voltage; and
   an adjustment-purpose closed circuit that comprises a variable load and an adjustment inductor that forms magnetic coupling with the inductor of the resonance circuit.

2. The toner detecting device according to claim 1, further comprising an oscillation circuit that oscillates and thereby generates a reference signal of a predetermined frequency, and provides the reference signal to the resonance circuit;
   wherein the resonance circuit generates the output voltage corresponding to the reference signal; and
   the detecting circuit detects the toner on the basis of an amplitude of the output voltage.

3. The toner detecting device according to claim 1, wherein the resonance circuit is a resonance circuit in an LC oscillation circuit; and
   the detecting circuit detects the toner on the basis of a frequency of the output voltage.

4. The toner detecting device according to claim 1, wherein the inductor of the resonance circuit is formed with a wiring pattern on a printed circuit board; and
   the adjustment inductor is formed with a wiring pattern on a printed circuit board.

* * * * *